United States Patent
Tamura

(10) Patent No.: US 6,536,123 B2
(45) Date of Patent: Mar. 25, 2003

(54) THREE-AXIS MAGNETIC SENSOR, AN OMNIDIRECTIONAL MAGNETIC SENSOR AND AN AZIMUTH MEASURING METHOD USING THE SAME

(75) Inventor: Yasuhiro Tamura, Nichome Yashio (JP)

(73) Assignee: Sensation, Inc., Tokyo (JP)

( * ) Notice: Subject to any disclaimer, the term of this patent is extended or adjusted under 35 U.S.C. 154(b) by 61 days.

(21) Appl. No.: 09/738,004

(22) Filed: Dec. 14, 2000

(65) Prior Publication Data

US 2002/0056202 A1 May 16, 2002

(51) Int. Cl.[7] .............................................. G01C 17/38
(52) U.S. Cl. ............................ 33/356; 33/354; 33/273
(58) Field of Search ............................. 33/355 R, 356, 33/354, 304, 308, 310, 312, 313, 273, 361; 701/220

(56) References Cited

U.S. PATENT DOCUMENTS

| | | | | |
|---|---|---|---|---|
| 3,936,949 A | * | 2/1976 | Devaud ........................ 33/354 |
| 4,414,753 A | * | 11/1983 | Moulin et al. ................ 33/356 |
| 4,452,075 A | * | 6/1984 | Bockhorst et al. ............ 33/312 |
| 4,527,155 A | | 7/1985 | Yamaki et al. |
| 4,539,760 A | * | 9/1985 | Marchent et al. ............. 33/356 |
| 4,686,772 A | * | 8/1987 | Sobel .......................... 33/356 |
| 4,831,563 A | | 5/1989 | Ando et al. |
| 4,914,605 A | | 4/1990 | Loughmiller, Jr. et al. |
| 5,105,548 A | * | 4/1992 | Fowler ........................ 33/356 |
| 5,172,480 A | * | 12/1992 | Labuc et al. ................. 33/313 |
| 5,297,051 A | | 3/1994 | Arakawa et al. |
| 5,317,515 A | | 5/1994 | Matsuzaki |
| 5,321,631 A | * | 6/1994 | Germanetti .................. 33/356 |
| 5,435,069 A | * | 7/1995 | Nicholson .................... 33/313 |
| 5,552,989 A | | 9/1996 | Betrand |
| 5,592,195 A | | 1/1997 | Misono et al. |
| 5,617,317 A | * | 4/1997 | Ignagni .................... 364/449.9 |
| 5,742,924 A | | 4/1998 | Nakayama |
| 5,745,866 A | | 4/1998 | Steiner |
| 5,862,498 A | | 1/1999 | Koyanagi et al. |
| 5,917,436 A | | 6/1999 | Endo et al. |
| 5,941,932 A | | 8/1999 | Aikawa er al. |
| 5,941,934 A | | 8/1999 | Sato |
| 5,953,683 A | * | 9/1999 | Hansen et al. ............. 33/355 R |
| 5,964,810 A | | 10/1999 | Hirano et al. |
| 5,012,014 A | | 1/2000 | Koyanagi et al. |
| 6,016,120 A | * | 1/2000 | McNabb et al. ......... 342/357.06 |
| 6,023,229 A | * | 2/2000 | Bugno et al. .............. 33/355 R |
| 6,115,025 A | | 9/2000 | Buxton et al. |
| 6,140,933 A | * | 10/2000 | Bugno et al. .............. 33/355 R |
| 6,157,342 A | | 12/2000 | Okude et al. |
| 6,253,152 B1 | | 6/2001 | Ito |
| 6,282,496 B1 | * | 8/2001 | Chowdhary .................. 701/220 |
| 6,366,856 B1 | * | 4/2002 | Johnson ....................... 701/213 |

FOREIGN PATENT DOCUMENTS

JP         11118892       4/1994    ........... G01R/33/02

* cited by examiner

Primary Examiner—Diego Gutierrez
Assistant Examiner—Mirellys Jagan
(74) Attorney, Agent, or Firm—Gray Cary Ware & Friedenrich LLP

(57) ABSTRACT

A hybrid three-axis magnetic sensor for calculating the accurate direction of the earth magnetism. The hybrid three-axis magnetic sensor includes: a flux gate type magnetic sensor which is so formed that a base serves as a main member and detects two axis components of a magnetic vector defined by a plane parallel to the base; a Hall element which detects another component of the magnetic vector orthogonal to the base; a tilt sensor which detects a tilt angle of the base; and a CPU, wherein the flux gate type magnetic sensor and the Hall element are integrally structured together as a hybrid IC. The thus detected three dimensional magnetic vector is corrected in the light of inclination of the base, so that the direction of the earth magnetism is accurately calculated.

8 Claims, 10 Drawing Sheets

THREE-AXIS MAGNETIC SENSOR, AN OMNIDIRECTIONAL MAGNETIC SENSOR AND AN AZIMUTH MEASURING METHOD USING THE SAME

BACKGROUND OF THE INVENTION

1. Field of the Invention

The present invention relates to a measuring technique of the earth's natural magnetism, and it particularly relates to a terrestrial magnetism detecting sensor which corrects the error encountered in azimuth calculation, and also relates to an azimuth measuring method thereof.

2. Description of the Related Art

The terrestrial magnetism detecting sensor is utilized to measure the orientation of an observation spot. The terrestrial magnetism detecting sensor also simply referred to as a magnetic sensor or a terrestrial magnetic sensor is placed on a horizontal plane at the observation spot, and detects biaxial or two-axis components of a terrestrial magnetic vector in the horizontal plane. The magnetic bearing is calculated based on the two axis components detected by the terrestrial magnetism detecting sensor. The terrestrial magnetism detecting sensor is used in the navigation system employed in an automobile, and is put on the market after certain calibration procedure has been performed to correct the magnetic effect.

On the other hand, it is widely prevalent that the map data are displayed in the cellular phone and other mobile terminals. In the light of this current situation, the applicant of the present invention first propose that the terrestrial magnetic sensor be built into portable equipment such as the cellular phone and mobile terminal, and came to recognize the following objects in the course of examining the realization of his proposal. Namely, the portable equipment may be held at any position depending on the posture of an owner of the portable equipment or how it is held by the owner, so that the direction of the portable equipment is not stabilized and constantly changes. Thus, the terrestrial magnetic sensor equipped in the portable equipment may be inclined by any possible tilt angle with respect to the horizontal position, and its tilt angle may constantly fluctuate. Therefore, under such a usage environment, besides the removal of the static magnetic effect as described above, an effect due to the change of the posture and holding position need be eliminated so that detection signals of the terrestrial magnetic vector can be automatically corrected.

SUMMARY OF THE INVENTION

The present invention has been made by the applicant in recognition of the above and an object thereof is to provide a compact-size terrestrial magnetic sensor capable of automatically correcting inclination, and an azimuth measuring method utilizing the terrestrial magnetic sensor.

In Japanese Patent Application No. 2000-104689, the applicant of the present invention proposed a portable terminal equipment to which a two-axis magnetic sensor is built in, and proposed a position data display system which can process a map according to the orientation of the map displayed in the portable terminal equipment. Moreover, the applicant of the present invention herewith proposes an omnidirectional magnetic sensor which incorporates a tilt sensor or inclination sensor into a magnetic sensor and which is capable of automatically correcting the inclination in order to improve usability of the system.

According to an aspect of the present invention relating to a three axis magnetic sensor, the three axis magnetic sensor is so structured that the two axis magnetic sensor and a magnetism detecting element are integrally structured as a hybrid IC. The two axis magnetic sensor is so formed that a base serves as a main member and detects two axial components specified by a plane parallel to the base. The magnetic detecting element detects a component of a direction orthogonal to the plane. Thereby, the three axis magnetic sensor can detect three axial component of the magnetic vector of the terrestrial magnetism. As the magnetism detecting element, a magnetic induction element such as a Hall element which detects magnetism by the Hall effect may be used, or a magneto-resistance effect element such as an MR (magnetoresistive) element which detects the magnetism by a phenomenon in which an electric resistance varies relative to magnetization of ferromagnetic body may be used.

The two axis magnetic sensor may be structured such that a coil pattern for detecting the two axis components of the magnetic vector is formed on a stacked base. The two axis magnetic sensor may be a flux gate type magnetic sensor in which an amorphous ring coil serves as a core, and a first coil base for detecting a magnetic field component in the X axis of a plane parallel to the base and a second coil base for detecting a magnetic field component in the Y axis of the plane are stacked on the outer surface of an exciting coil base.

As a mounting embodiment in which the two axis magnetic sensor and the magnetism detecting element are integrally structured together, the base on which the two axis magnetic sensor is formed may include a pattern for transmitting a detection signal outputted from the magnetism detecting element, so that the detection signal may be directly introduced into the base via the pattern when the magnetism detecting element is mounted on the base.

According to another aspect of the present invention relating to an omnidirectional magnetic sensor, the omnidirectional magnetic sensor is structured such that a three axis magnetic sensor for detecting a three dimensional magnetic vector and a tilt sensor for detecting a tilt angle of the base are integrally formed together. "Being formed on the base" indicates, for example, that at least part of a structural component of the three axis magnetic sensor is so formed that the base serves as a main member, and it includes cases where other structural components of the three axis magnetic sensor is mounted outside the base and where all structural components of the three axis magnetic sensor are so formed that the base serves as the main member. For example, the two axis magnetic sensor which detects two axis components of a magnetic vector specified by a plane parallel to the base, may be formed with the base as the main member, while a magnetism detecting element which detects a component in a direction vertical to the plane of the magnetic vector may be so mounted that the magnetism detecting element is connected to a pattern formed on the base.

The tilt sensor may detect a tilt angle in the X axis and a tilt angle in the Y axis specified by a plane parallel to the base. The tilt sensor may be an acceleration sensor which detects displacement in the two axis direction or the three axis direction.

The base may include a pattern which transfers a detection signal outputted from the tilt sensor, so that the detection signal may be directly introduced to the base via the pattern when the tilt sensor is mounted on the base.

The omnidirectional magnetic sensor as recited may further comprise a film base mounted on the base in the form externally extended from the base, where the tilt sensor is mounted on the film base, the film base is folded toward the base, and whole members including the tilt sensor are fixed.

Moreover, the three axis magnetic sensor may be so formed that the base servers as a main member, and the three axis magnetic sensor may include a two axis magnetic sensor which detects two axis components of a magnetic vector defined by a plane parallel to the base, and a magnetism detecting element which detects a component corresponding to a direction orthogonal to the plane of the magnetic vector. The magnetism detecting element may be mounted on the film base. A flip chip method may be utilized to mount the element on the film.

According to still another aspect of the present invention relating to an azimuth measuring method, the azimuth measuring method includes the steps of: receiving a signal of a three-dimensional magnetic vector detected by a magnetic sensor; receiving inclination formed between three dimensional coordinates specified by the magnetic vector and a horizontal plane, from a tilt sensor; and calculating a magnetic vector which ought to be detected when the magnetic sensor is placed horizontal to the horizontal plane, based on the magnetic vector detected by the magnetic sensor and the inclination detected by the tilt sensor. Moreover, the azimuth measuring method may further include the step of calculating magnetic declination based on the calculated magnetic vector.

Moreover, any arbitrary combination of the above-mentioned structural components in the present invention is still effective as an embodiment when applied as a method, a sensor, and a system and so forth.

Moreover, this summary of the invention does not necessarily describe all necessarily features so that the invention may also be sub-combination of these described features.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

The structure of an omnidirectional magnetic sensor according to present embodiments will be described referring to FIGS. 1, 2 and 3A and 3B. A structure of a biaxial magnetic sensor used in the omnidirectional magnetic sensor is described in FIG. 1. A structure of a tilt sensor used in the omnidirectional sensor is described in FIG. 2 whilst a structure of the overall omnidirectional magnetic sensor is shown in FIGS. 3A and 3B.

Figure 1:
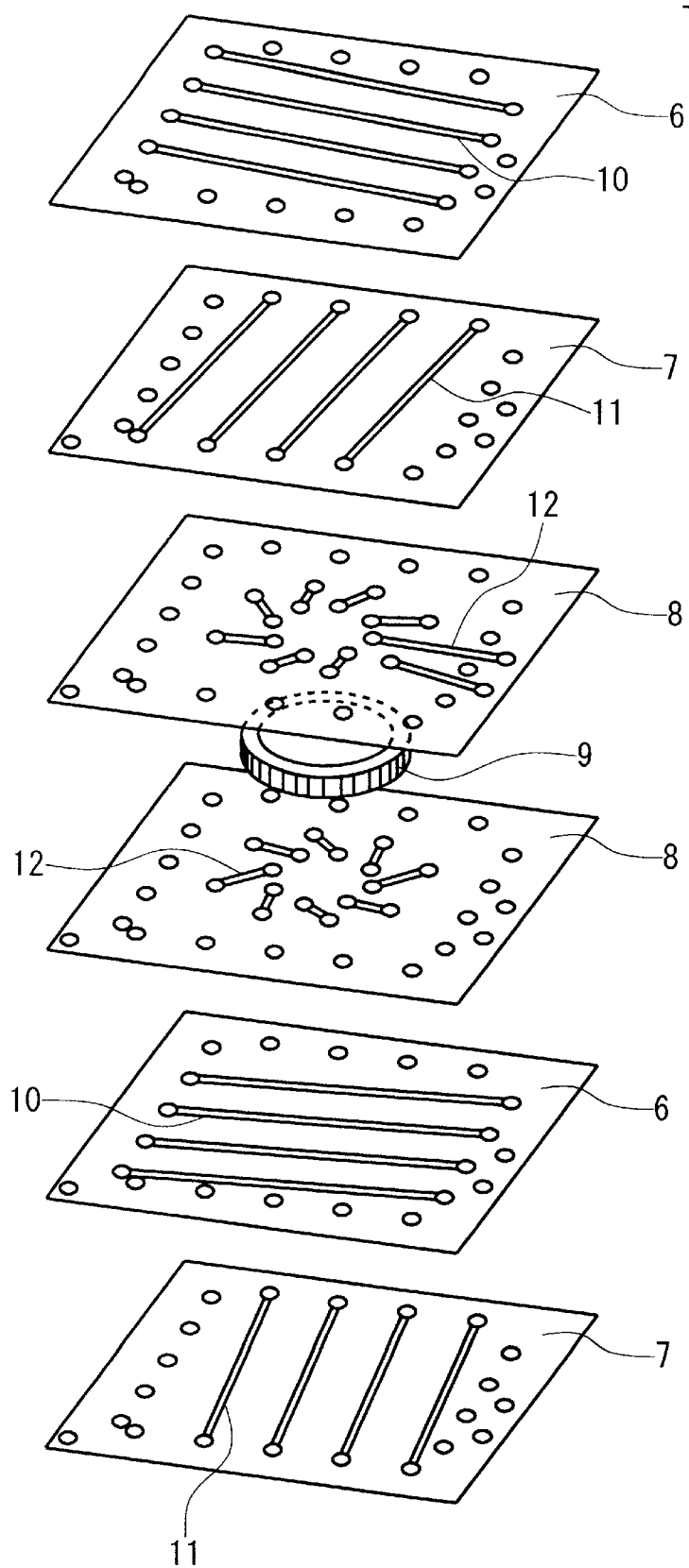
FIG. 1 shows disassembly of a flux gate type magnetic sensor 100 which is an example of the biaxial terrestrial magnetic sensor.

FIG. 1 shows disassembly of a flux gate type magnetic sensor 100 which is an example of a biaxial terrestrial magnetic sensor. The flux gate type magnetic sensor 100 is the flux gate type magnetic sensor which is disclosed in Japanese Patent Application Laid-open No. Hei9-43322 (corresponding to U.S. Pat. No. 5,936,403) and Japanese Patent Application Laid-Open No. Hei11-118892. The flux gate type magnetic sensor 100 is structured in a manner such that a ring core 9 formed by a ring-shaped amorphous core serves as a core and in both directions upward and downward of the core there are stacked a base 8 for use with an exciting coil, on which an exciting coil pattern 12 is etched, an Y-axis directional magnetic field detecting coil base 7 on which an Y coil pattern 11 is etched, and an X-axis directional magnetic field detecting coil base 6 on which an X coil pattern 10 is etched, in the order shown in FIG. 1.

Figure 2:
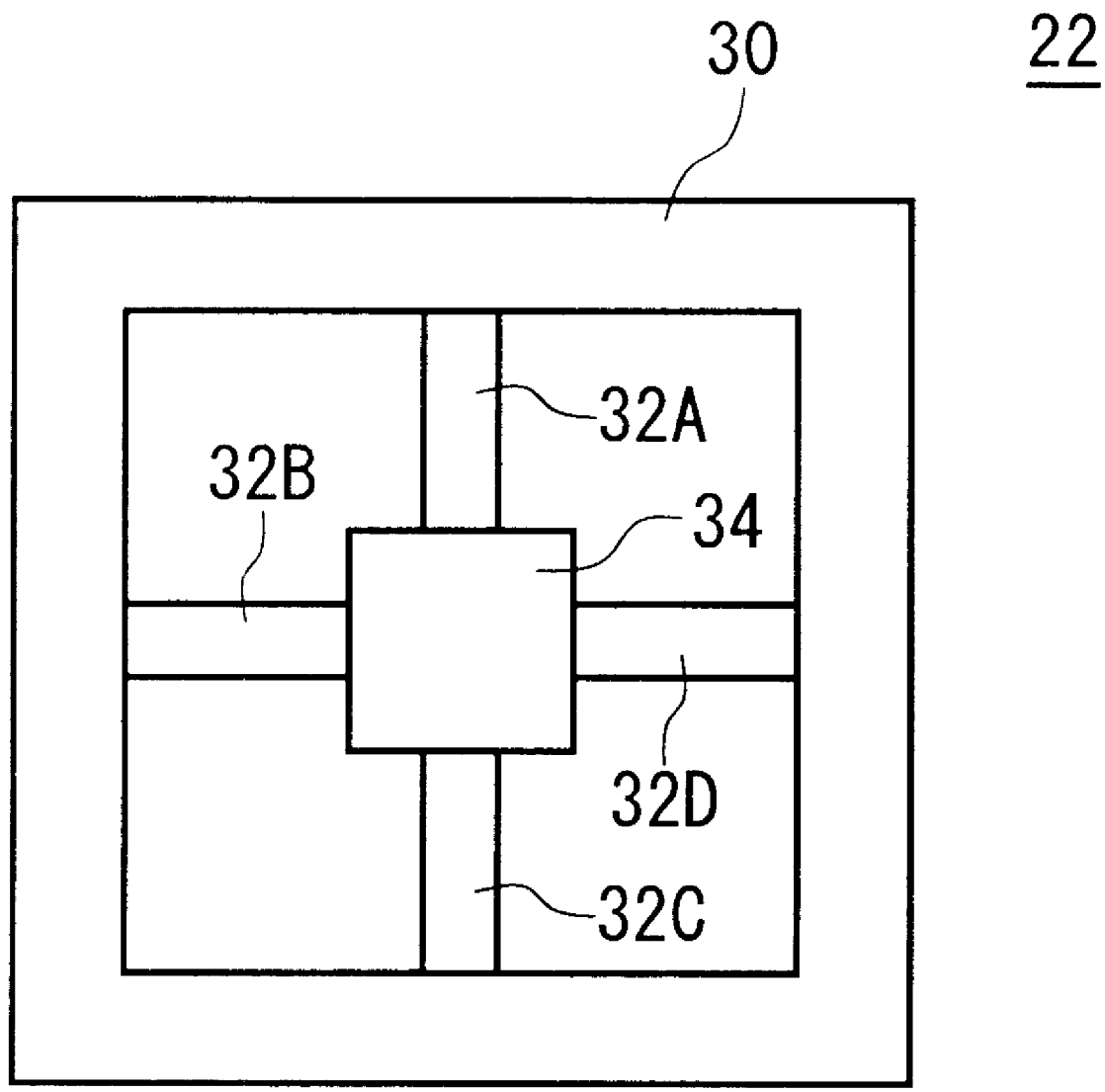
FIG. 2 shows the principle of a tilt sensor 22.

FIG. 2 shows the principle of a tilt sensor 22. The tilt sensor is of a structure such that a weight member 34 is supported by piezo elements 32A, 32B, 32C and 32D (as an example of a piezoelectric element) and a square pillar 30. Thus, inclination can be measured by displacement, of the weight member 34, detected by the piezo elements 32A–32D.

Figure 3A:
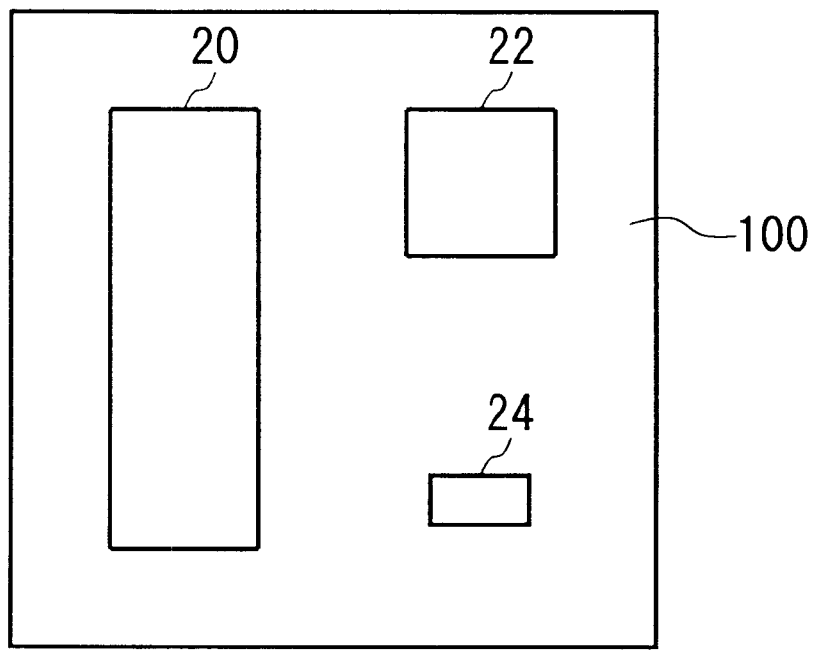
FIGS. 3A and 3B show the structure of a hybrid magnetic sensor 200 which is an example of the omnidirectional sensor.
Figure 3B:
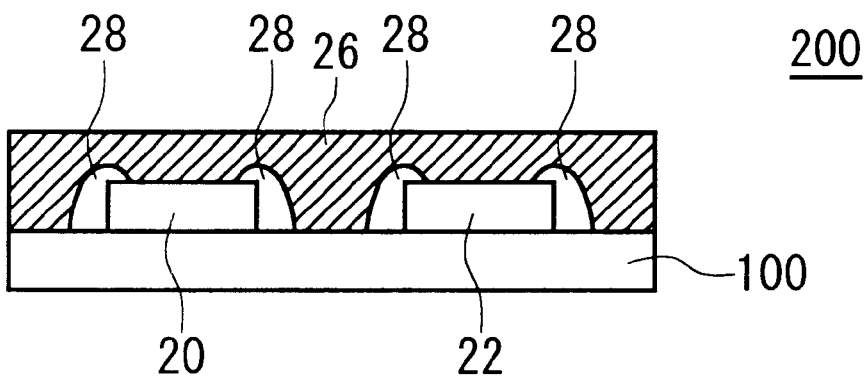

FIGS. 3A and 3B show the structure of a hybrid magnetic sensor 200 which is an example of the omnidirectional magnetic sensor. FIG. 3A is a top view of the hybrid magnetic sensor 200. FIG. 3B is a cross sectional view of the hybrid magnetic sensor 200. The hybrid magnetic sensor 200 comprises: the flux gate type magnetic sensor 100 as a base; a CPU 20, provided on a pattern formed on the base, as an arithmetic processing portion; the tilt sensor 22 provided on the base; a Hall element 24 which is an example of the magnetism detecting element. The CPU 20, tilt sensor 22 and Hall element 24 are mounted on the base 100 by bonding 28, and are secured and covered with silicon resin 26 so as to be integrally structured of the hybrid type. The hybrid magnetic sensor 200 is so structured that detection signals outputted from the tilt sensor 22 and the Hall element 24 are directly introduced into to the base via the pattern, and the CPU 20 receives the detection signals of the tilt sensor 22 and Hall element 24 as well as a detection signal outputted from the flux gate type magnetic sensor 100 and performs a correction calculation (described later) so as to output a corrected signal. The Hall element 24 detects a magnetic component in the direction orthogonal to the base. A tri-axial (three axis) magnetic sensor is structured which can detect a three-dimensional magnetic vector, by thus combining the flux gate type magnetic sensor 100 and the Hall element 24. It is to be noted that as the magnetism detecting element a magnetic induction element such as the Hall element 24, and a magneto-resistance effect element such as an MR (magnetoresistive) element may be used.

Figure 4:
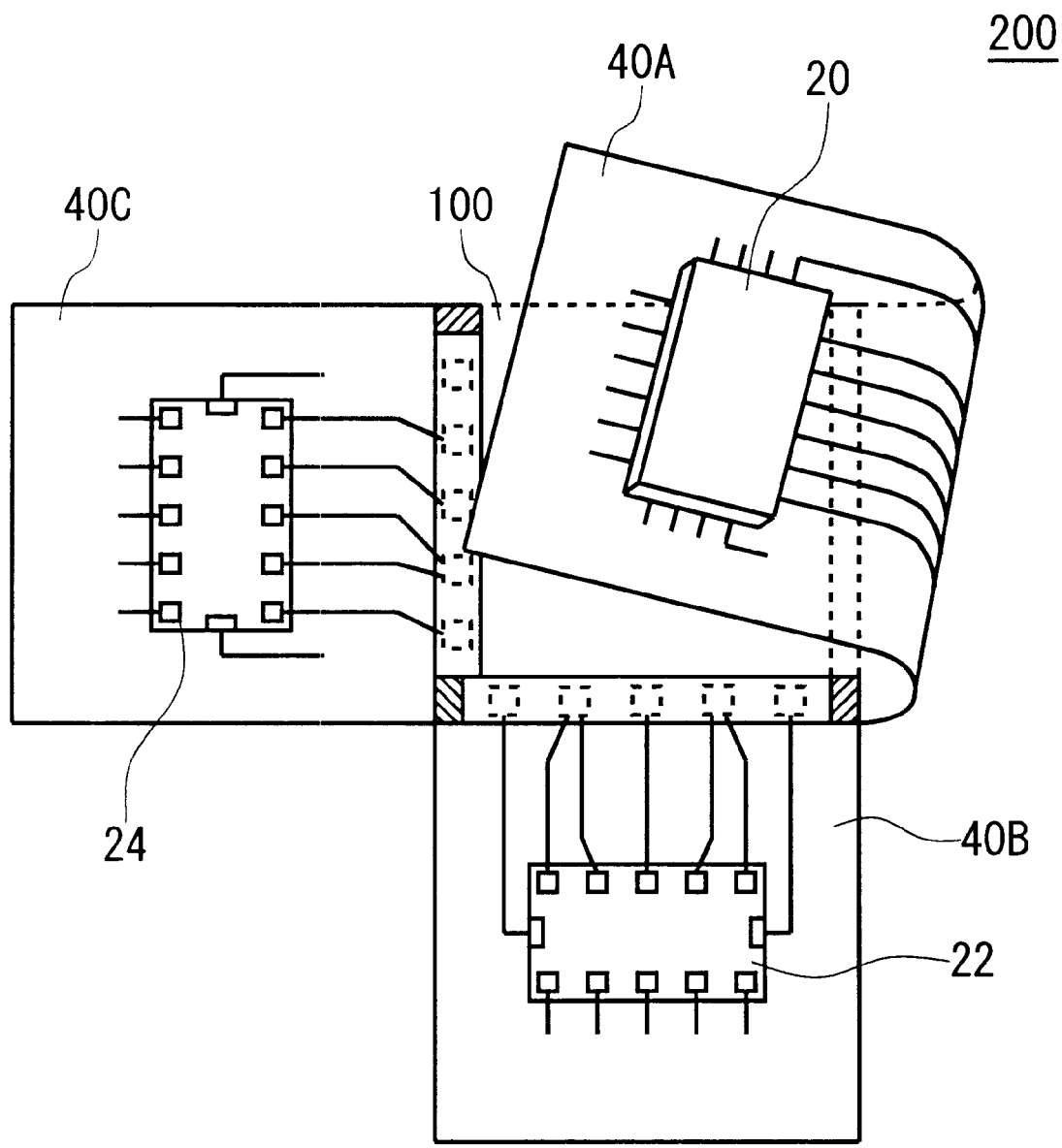
FIG. 4 is a schematic diagram showing a hybrid magnetic sensor 200 according to another embodiment.

FIG. 4 is a schematic diagram showing a hybrid magnetic sensor 200 according to another embodiment. Flexible film bases 40A, 40B and 40C are mounted on the edges of the flux gate type magnetic sensor 100, so that the CPU 20, tilt sensor 22 and Hall element 24 are mounted on the patterns formed in the film bases 40A–40C. The film bases 40A–40C are folded toward the flux gate type magnetic sensor 100 so as to be fixed as a whole. A certain degree of freedom is allowed when designing in terms of elements arranged on the film bases 40A–40C. Namely, each of the CPU 20, tilt sensor 22 and Hall element 24 may be mounted on any one of the film bases 40A–40C. Moreover, all of the CPU 20, tilt sensor 22 and Hall element 24 may be mounted on at least one of the film bases 40A–40C, thus all of bases 40A–40C is not necessarily used to mount them. It is to be noted that a flip chip method may be utilized to mount the element on the film.

In both structures shown in FIGS. 3A–3B and FIG. 4, the hybrid magnetic sensor 200 is of a hybrid IC type structure such that the magnetism detecting element which detects the magnetic component orthogonal to the base and the tilt sensor which detects the inclination of the base are integrally mounted on the base on which the biaxial magnetic sensor that detects the biaxial magnetic component in the second dimensional plane is mounted. Thus, the compactness is realized by combining a plurality of sensors in an integrally mounted manner.

Figure 5:
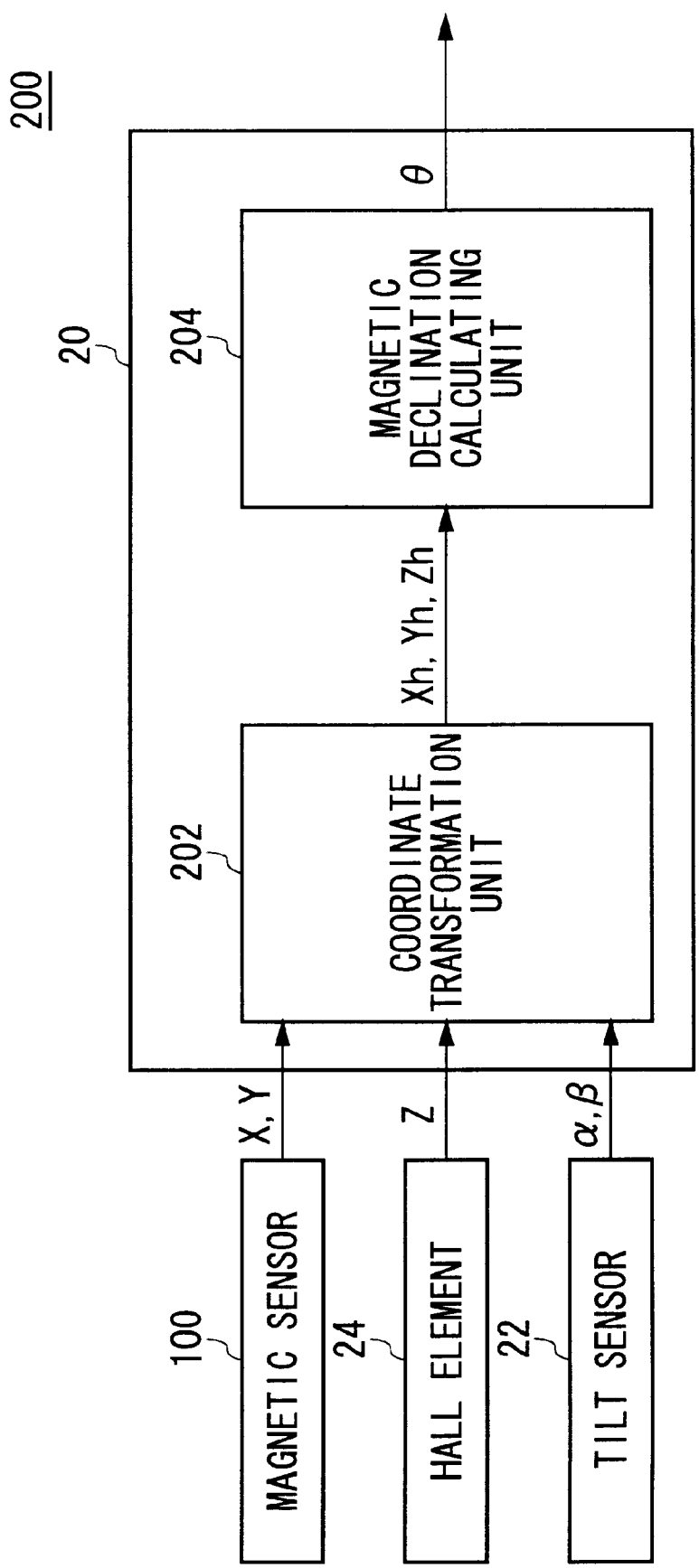
FIG. 5 is a functional block diagram of the hybrid magnetic sensor 200.

FIG. 5 is a functional block diagram of the hybrid magnetic sensor 200. The flux gate type magnetic sensor 100 outputs magnetic components x and y in the directions of respective second-dimensional coordinate axes X axis and Y axis specified by a plane of the base. The Hall element 24 outputs a magnetic component z in the Z-axis direction orthogonal to the plane of the base. The tilt sensor 22 outputs a tilt angle α in the X-axis direction (also referred to as a pitch angle hereinbelow) and a tilt angle β in the Y-axis direction (also referred to as a roll angle hereinbelow).

The CPU 20 includes a coordinate transformation unit 202 and a magnetic declination calculating unit 204. The coordinate transformation unit 202 carries out a correction calculation by which to eliminate an effect caused by inclination, based on a magnetic vector (x, y, z), the pitch angle α and roll angle β. Thus, the coordinate transformation unit 202 calculates a horizontal magnetic vector (xh, yh, zh) detected when the base of the hybrid magnetic sensor 200 is placed horizontally with respect to the horizontal plane. The magnetic declination calculating unit 204 inputs the horizontal magnetic vector (xh, yh, zh) so as to calculate the magnetic declination θ. The magnetic declination calculating unit 204 may additionally calculate a dip φ.

Figure 6:
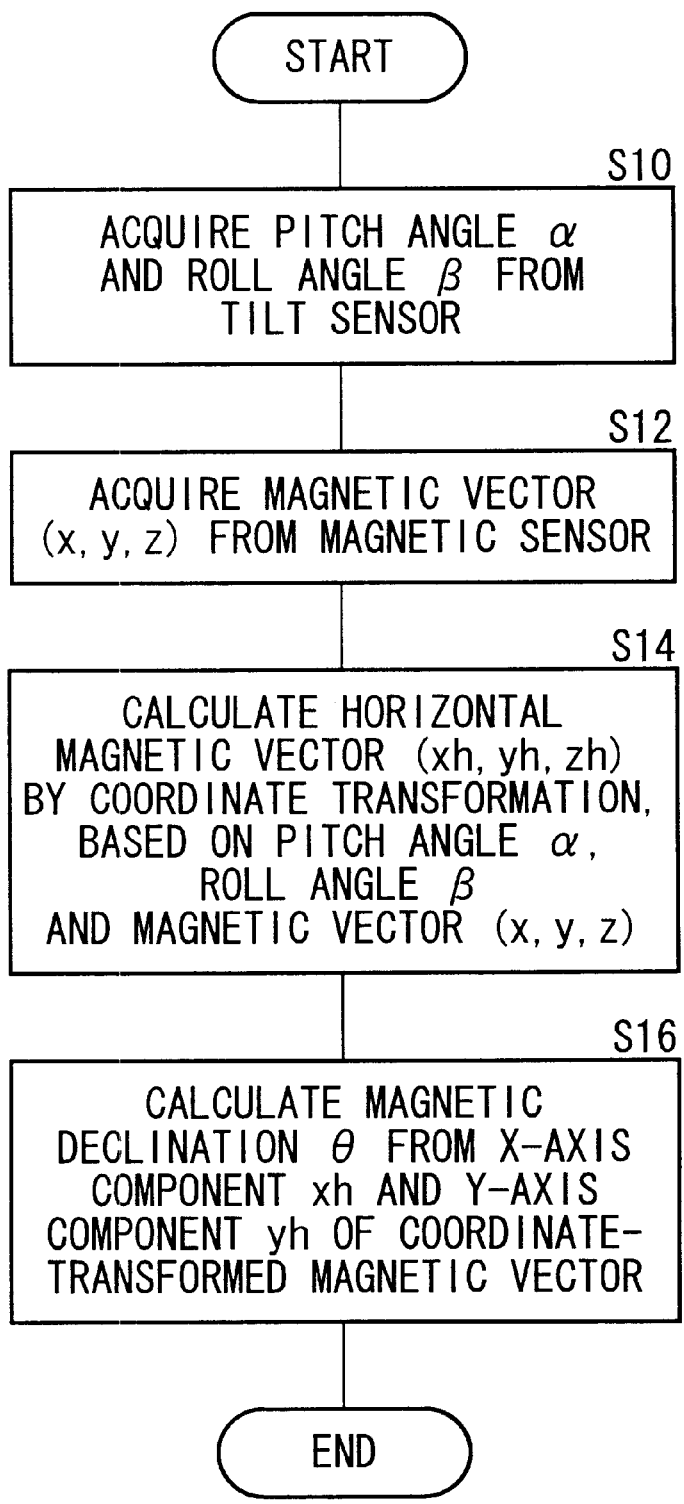
FIG. 6 is a flowchart showing the correction calculation performed by the CPU 20 of the hybrid magnetic sensor 200.

FIG. 6 is a flowchart showing the correction calculation performed by the CPU 20 of the hybrid magnetic sensor 200. The coordinate transformation unit 202 acquires the pitch angle α and the roll angle β (S10) from the tilt sensor 22, and also acquires components x and y in the X-axis and Y-axis directions, respectively, of the magnetic vector, from the flux gate type magnetic sensor 100, and a component z in the Z-axis direction of the magnetic vector, from the Hall element 24 (S12). The coordinate transformation unit 202 calculates the horizontal magnetic vector (xh, yh, zh) detected when the base of the hybrid magnetic sensor 200 is placed horizontally with respect to the horizontal plane (S14). The actual calculation is carried out in what follows.

Since when the base of the hybrid magnetic sensor 200 is tilted by α about the X axis and by β about the Y axis of a horizontal spatial coordinate system its magnetic vector is represented by (x, y, z), the horizontal magnetic vector (xh, yh, zh) is obtained by rotating the magnetic vector (x, y, z) by −β about the Y axis and by −α about the X axis as in the following equation (1).

$$[x\ y\ z] \begin{bmatrix} \cos\beta & 0 & \sin\beta \\ 0 & 1 & 0 \\ -\sin\beta & 0 & \cos\beta \end{bmatrix} \begin{bmatrix} 1 & 0 & 0 \\ 0 & \cos\alpha & \sin\alpha \\ 0 & -\sin\alpha & \cos\alpha \end{bmatrix} = \tag{1}$$

$$[x\ y\ z] \begin{bmatrix} \cos\beta & -\sin\beta\sin\alpha & \sin\beta\cos\alpha \\ 0 & \cos\alpha & \sin\alpha \\ -\sin\beta & -\cos\beta\sin\alpha & \cos\beta\cos\alpha \end{bmatrix}$$

Thus, the horizontal magnetic vector (xh, yh, zh) is expressed by:

$xh = x \cos\beta - z \sin\beta$ $yh = -x \sin\beta \sin\alpha + y \cos\alpha - z \cos\beta \sin\alpha$ $zh = x \sin\beta \cos\alpha + y \sin\alpha + z \cos\beta \cos\alpha$ \hfill (2)

The magnetic declination calculating unit 204 obtains the magnetic declination θ of the terrestrial magnetism (S16) based on the coordinate-transformed X-axis component xh and Y-axis component yh of the magnetic vector, using the following equation (3).

$\theta = \arctan(yh/xh)$ \hfill (3)

In the magnetic declination calculating unit 204, the dip of the terrestrial magnetism, that is the angle φ formed between the terrestrial magnetic vector and the vertical direction, may further be obtained using the following equation (4).

$\phi = \arccos(zh/r)$ \hfill (4)

where r is the norm (magnitude) of the magnetic vector (xh, yh, zh) (namely the total magnetic force).

Figure 7:
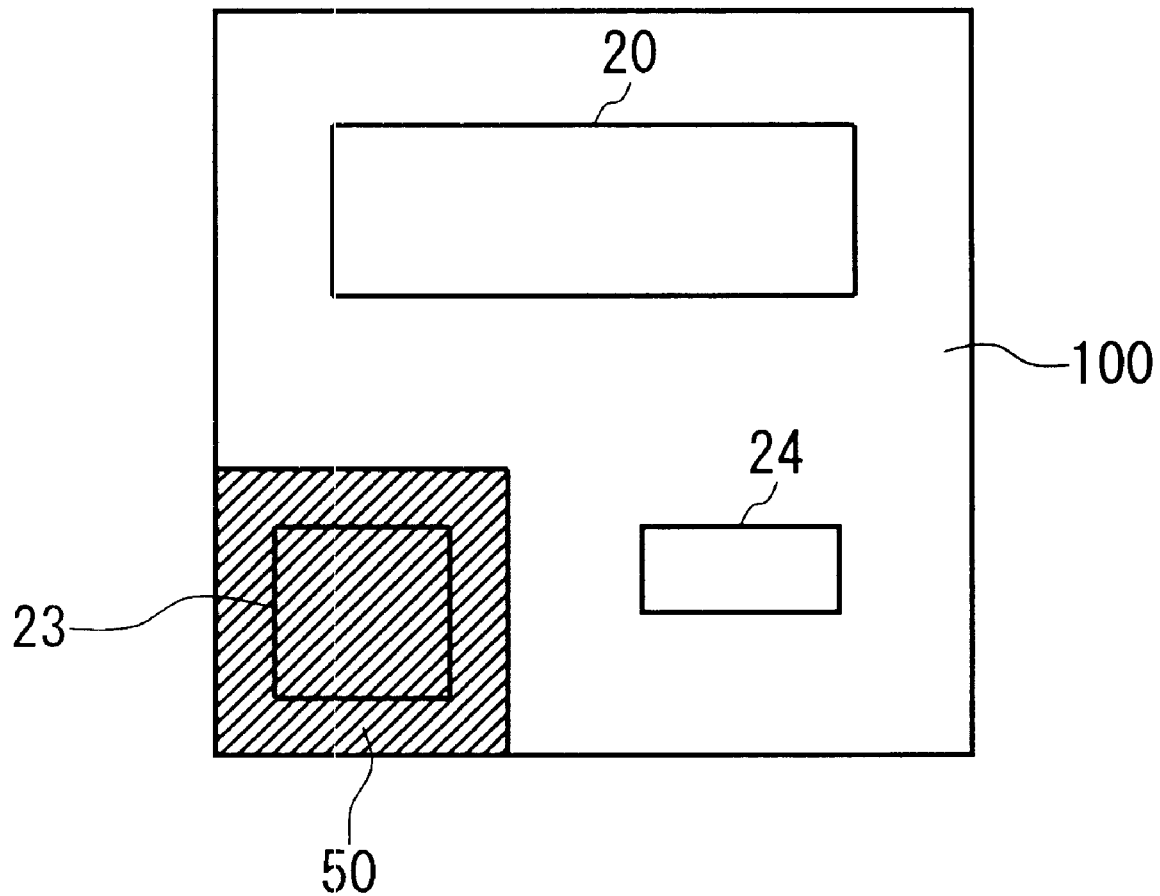
FIG. 7 is a top view of the hybrid magnetic sensor 200 according to still another embodiment.

FIG. 7 is a top view of the hybrid magnetic sensor 200 according to still another embodiment. A CPU 20, a tilt sensor 23 and a Hall element 24 are mounted on the top of the flux gate type magnetic sensor 100 serving as a base. The structure of the tilt sensor 23 according to this embodiment is the same as that of the tilt sensor 22 shown in FIG. 2. However, the structure differs in that the tilt sensor 23 is covered with a flexible gel silicon 50 so that the outside air pressure can be detected from a difference between the outside air pressure and internal pressure in the sensor. Other structure of the hybrid magnetic sensor 200 is the same as in FIG. 3B, but the whole unit except the tilt sensor 22 is secured by the silicon resin 26. In the hybrid magnetic sensor 200 thus packaged, the altitude as well as the azimuth of an observation spot can also be measured based on the outside air pressure.

Figure 8:
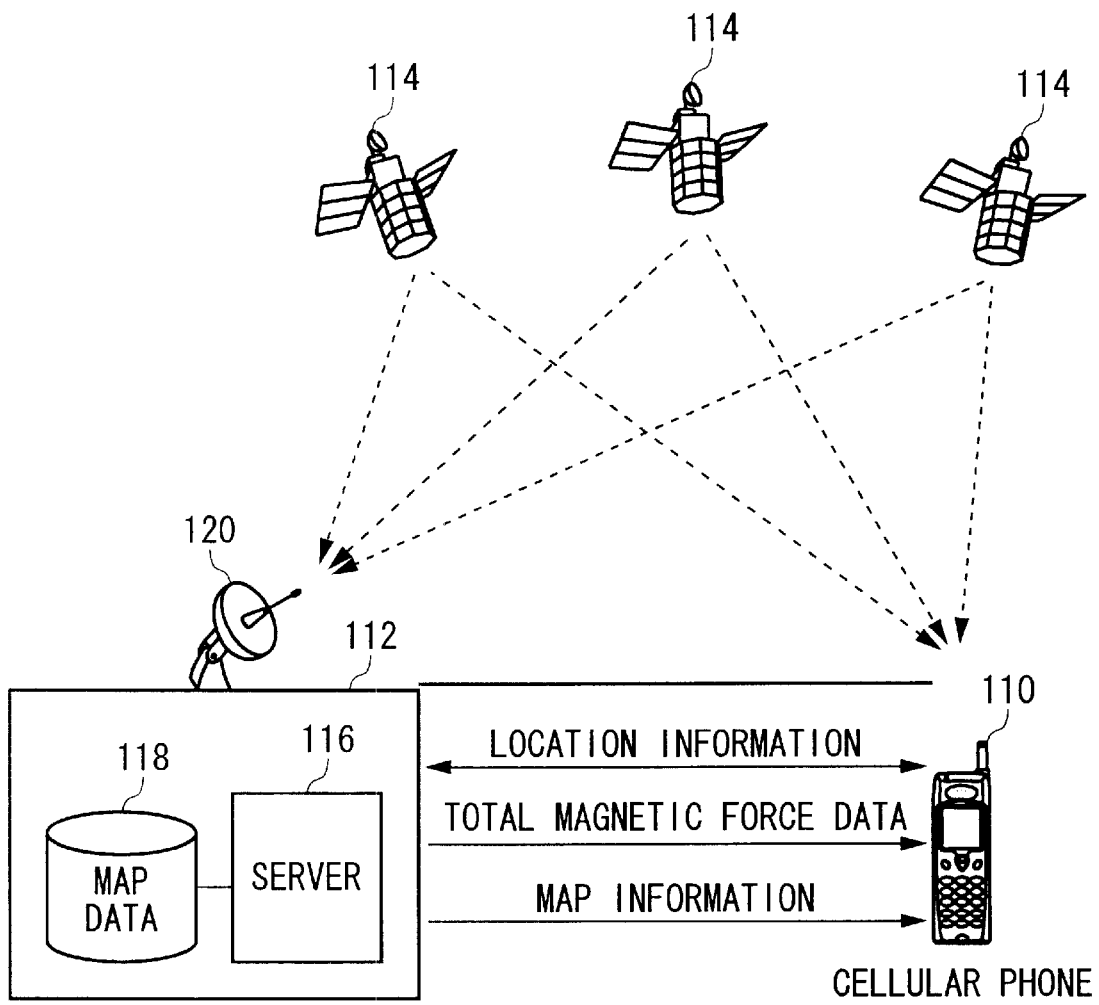
FIG. 8 an explanatory chart of an azimuth measuring system utilizing the hybrid magnetic sensor 200.

FIG. 8 is an explanatory chart of an azimuth measuring system utilizing the hybrid magnetic sensor 200. A cellular phone 110 contains the hybrid magnetic sensor 200 and a GPS (global positioning system) receiving unit 102. The cellular phone 110 receives position data from a plurality of GPS satellites 114. The position data include latitude and longitude of an observation spot. The cellular phone 110 transmits the position data received to a ground station 112. The ground station 112 includes a server 116, map data 118 and a GPS antenna 120. The accurate latitude and longitude of the ground station 112 are known. Utilizing the known latitude and longitude of the ground station 112 as reference data, the server 116 corrects the position data transmitted from the cellular phone 110, based on the position data received from a plurality of the GPS satellites 114 via the GPS antenna 120, so as to transmit correct position information to the cellular phone 110. Moreover, the server 116 transmits to the cellular phone 110 the total magnetic force data regarding the present position requested by the cellular phone 110, by extracting the total magnetic force data from the map data 118. Moreover, the server 116 extracts the map data from the map data 118, based on the present position of the cellular phone 110, and then transmits the map data to the cellular phone 110. Then, the map data are processed and displayed on the cellular phone 110, based on the azimuthal orientation of the terrestrial magnetism measured by the hybrid magnetic sensor 200.

Figure 9:
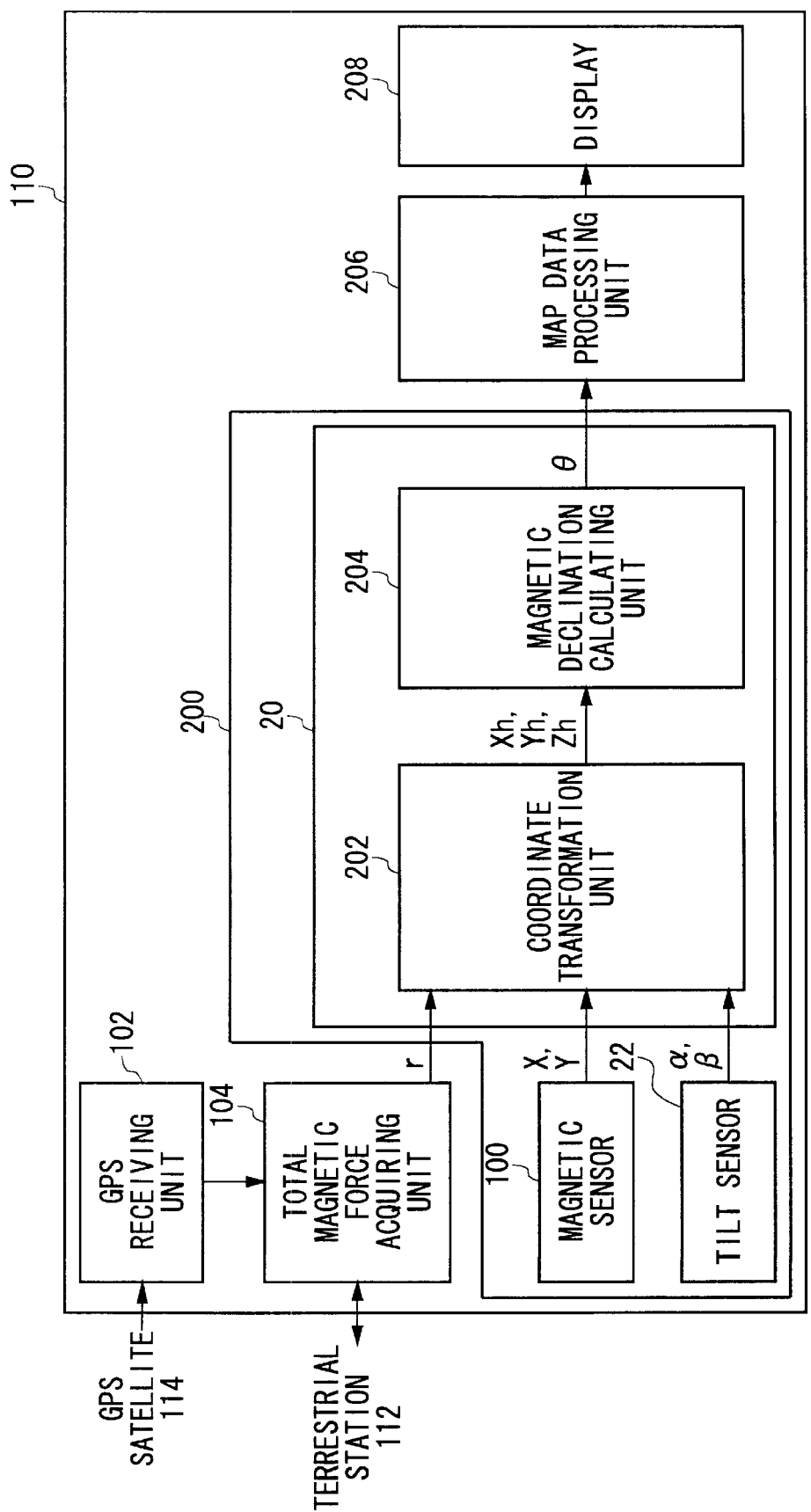
FIG. 9 is a functional block diagram of the cellular phone 110.

FIG. 9 is a functional block diagram of the cellular phone 110. The usual telephone calling system in the cellular phone will be omitted here. Referring to FIG. 9, various functions related to the azimuth measuring technique employed in the present invention will be described. The cellular phone 110 includes the GPS receiving unit which receives a GPS signal from the GPS satellite 114, a total magnetic force acquiring unit 104 which acquires total magnetic force data from the ground station 112, the hybrid magnetic sensor 200, a map data processing unit 206 and a display 208. The hybrid magnetic sensor 200 includes the flux gate type magnetic sensor 100, tilt sensor 22, coordinate transformation unit 202 and magnetic declination calculating unit 204.

The GPS receiving unit 102 receives from the GPS satellites 114 the position data of the observation spot while the total magnetic force acquiring unit 104 transmits to the ground station 112 the position data received by the GPS receiving unit 102, and receives the total magnetic force r from the ground station 112. The total magnetic force acquiring unit 104 inputs the total magnetic force r to the coordinate transformation unit 202. The X-axis component x and Y-axis component y, of the magnetic vector, detected by and outputted from the flux gate type magnetic sensor 100, and the pitch angle α and roll angle β outputted from the tilt sensor 22 are inputted to the coordinate transformation unit 202. In the coordinate transformation unit 202, a Z-axis component z of the magnetic vector is obtained based on the X-axis component x, Y-axis component y and the total magnetic force r. Then, the horizontal magnetic vector (xh, yh, zh) is obtained by the coordinate transformation utilizing the pitch angle α and roll angle β. The magnetic declination calculating unit 204 calculates the magnetic declination θ of the terrestrial magnetism based on the horizontal magnetic vector, so that the calculated magnetic declination θ is inputted to map processing unit 206.

The map data processing unit 206 processes the map data received from the ground station 112 based on the magnetic declination θ, and the display 208 displays the processed map data on screen. For example, the map data processing unit 206 rotates the map in such a manner that the orientation of the map is aligned with the magnetic declination θ. Thus, on the screen of the cellular phone 110, the map is displayed which is aligned with the direction which the cellular phone owner looks at.

Figure 10:
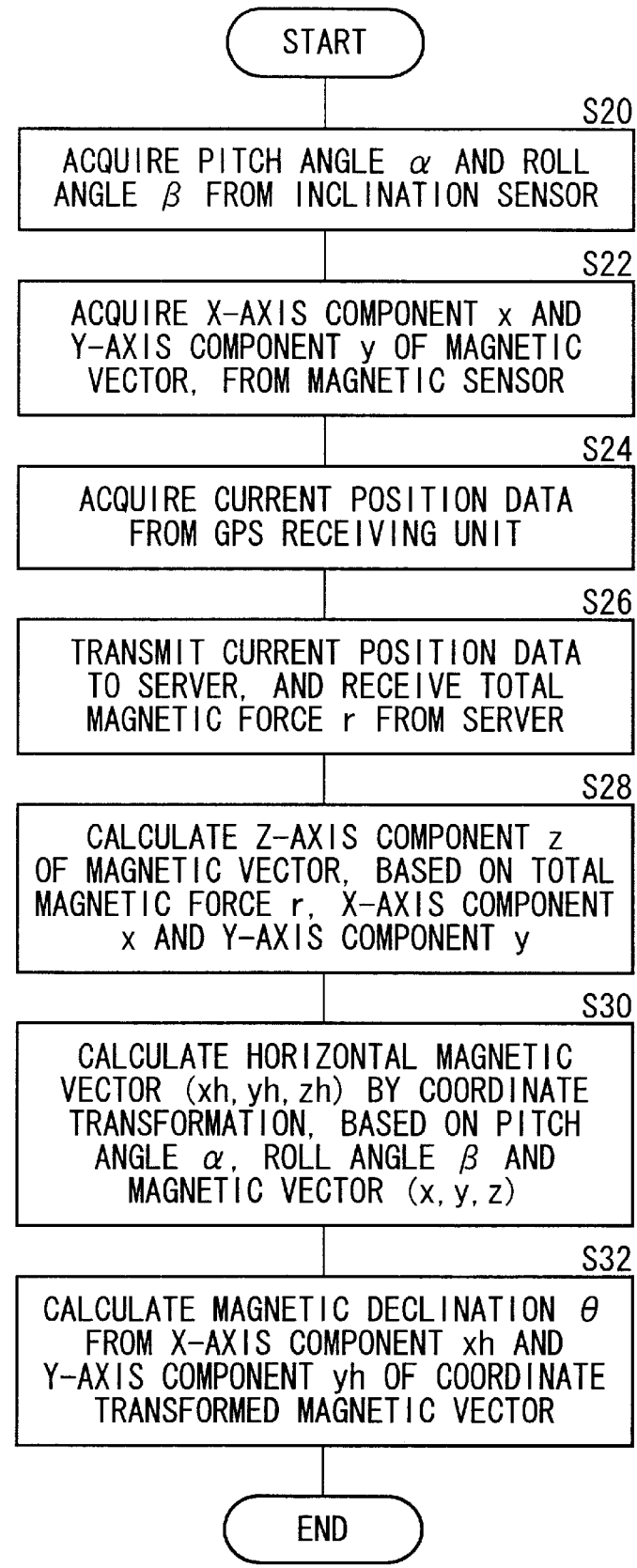
FIG. 10 is a flowchart of the azimuth measuring method according to the present invention.

FIG. 10 is a flowchart of the azimuth measuring method according to the present embodiment. The coordinate transformation unit 202 acquires the pitch angle α and roll angle β from the tilt sensor 22 (S20) so as to acquire the X-axis component x and Y-axis component y of the magnetic vector from the flux gate type-magnetic sensor 100 (S22). The GPS receiving unit 102 acquires the present position data (S24), and the total magnetic force acquiring unit 104 transmits the present position data to the server 116 of the ground station 112 so as to receive the total magnetic force r of the present position from the server 116 (S26). The coordinate transformation unit calculates the Z-axis component z from the total magnetic force r, the X-axis component x and Y-axis component y of the magnetic vector, utilizing the following equation (5) (S28).

$$z = \sqrt{r^2 - x^2 - y^2} \quad (5)$$

The coordinate transformation unit 202 obtains the horizontal magnetic vector (xh, yh, zh) by the coordinate transformation of the aforementioned equation (2), utilizing the pitch angle α and roll angle β (S30). The magnetic declination calculating unit 204 calculates the magnetic declination θ from the coordinate transformed X-axis component x and Y-axis component y of the magnetic vector, by the above-mentioned equation (3) (S32).

It is to be noted that the altitude of the observation spot together with latitude and longitude thereof may be transmitted to the server 116 of the ground station 112 by utilizing a hybrid magnetic sensor 200 capable of detecting the altitude shown in FIG. 7 as the hybrid magnetic sensor 200.

As described above, the hybrid magnetic sensor 200 according to the present embodiments is formed such that the base serves as a main member thereof, and is integrally structured such that the Hall element 24 and the tilt sensor 22 are mounted on the base, so as to realize compactness in size.

Moreover, by implementing the hybrid magnetic sensor 200 according to the present embodiments, the automatic correction against the inclination makes it possible to automatically correct and eliminate the effect caused by the inclination even when the hybrid magnetic sensor 200 is tilted in any direction or the inclination angle thereof varies and is not stabilized. Moreover, the hybrid magnetic sensor 200 can be easily built into portable equipment such as the cellular phone and mobile terminal. Note that the conventional magnetic azimuth sensor performs the calibration by use of a mechanical means such as a pendulum to maintain and track horizontality. Compared to such a conventional scheme, the hybrid magnetic sensor 200 thus formed according to the present embodiments is purely electronically operated, thus superior in responsibility, moreover there is no mechanical contacts thus capable of being used semipermanently. Moreover, since the hybrid magnetic sensor 200 is thus structured, it can be adapted to all possible positions and postures.

According to the present embodiments, the correction is carried out eliminating the effect caused by the inclination, so that the orientation of the terrestrial magnetism can be accurately measured.

Although the present invention has been described by way of exemplary embodiments, it should be understood that many changes and substitutions may be made by those skilled in the art without departing from the spirit and the scope of the present invention which is defined by the appended claims.

What is claimed is:

1. A three axis magnetic sensor, comprising:
   a two axis magnetic sensor which detects two axis components of a magnetic vector defined by a plane parallel to a base, said two axis magnetic sensor being so formed that the base serves as a main member; and
   a magnetic detecting element which detects a component corresponding to a direction orthogonal to the plane of the magnetic vector,
   wherein said two axis magnetic sensor and said magnetic detecting element are integrally structured together as a hybrid IC, and wherein a plurality of coil patterns which detect the two axis components of the magnetic vector are formed over stacked bases.

2. A three axis magnetic sensor as recited in claim 1, wherein said base includes a pattern which transfers a detection signal outputted from said magnetic detecting element.

3. An omnidirectional magnetic sensor, comprising:

a three axis magnetic sensor, formed on a base, which detects a three dimensional magnetic vector; and a tilt sensor which detects inclination of the base, wherein said three axis magnetic sensor and said tilt sensor are integrally structured together as a hybrid IC, and wherein the base includes a pattern which transfers a detection signal outputted from said tilt sensor, and the detection signal is directly introduced to the base via the pattern when said tilt sensor is mounted on the base.

4. An omnidirectional magnetic sensor, comprising:

a three axis magnetic sensor, formed on a base, which detects a three dimensional magnetic vector; and a tilt sensor which detects inclination of the base, wherein said tilt sensor detects a first inclination of an X axis and a second inclination of a Y axis which are parallel to the base, wherein said three axis magnetic sensor and said tilt sensor are integrally structured together as a hybrid IC, and wherein the base includes a pattern which transfers a detection signal outputted from said tilt sensor, and the detection signal is directly introduced to the base via the pattern when said tilt sensor is mounted on the base.

5. An omnidirectional magnetic sensor, comprising:

a three axis magnetic sensor, formed on a base, which detects a three dimensional magnetic vector; and a tilt sensor which detects inclination of the base, wherein said tilt sensor is an acceleration sensor which detects displacement in three axis directions, wherein said three axis magnetic sensor and said tilt sensor are integrally structured together as a hybrid IC, and wherein the base includes a pattern which transfers a detection signal outputted from said tilt sensor, and the detection signal is directly introduced to the base via the pattern when said tilt sensor is mounted on the base.

6. An omnidirectional magnetic sensor, comprising:

a three axis magnetic sensor, formed on a base, which detects a three dimensional magnetic vector;

a tilt sensor which detects inclination of the base; and a film base mounted on the base in the form externally extended from the base, wherein said tilt sensor is mounted on said film base, said film base is folded toward the base, and whole members including said tilt sensor are fixed;

wherein said three axis magnetic sensor and said tilt sensor are integrally structured together as a hybrid IC.

7. An omnidirectional magnetic sensor, comprising:

a three axis magnetic sensor, formed on a base, which detects a three dimensional magnetic vector;

a tilt sensor which detects inclination of the base, wherein said tilt sensor detects a first inclination of an X axis and a second inclination of a Y axis which are parallel to the base; and a film base mounted on the base in the form externally extended from the base, wherein said tilt sensor is mounted on said film base, said film base is folded toward the base, and whole members including said tilt sensor are fixed;

wherein said three axis magnetic sensor and said tilt sensor are integrally structured together as a hybrid IC.

8. An omnidirectional magnetic sensor, comprising:

a three axis magnetic sensor, formed on a base, which detects a three dimensional magnetic vector;

a tilt sensor which detects inclination of the base, wherein said tilt sensor is an acceleration sensor which detects displacement in three axis directions; and a film base mounted on the base in the form externally extended from the base, wherein said tilt sensor is mounted on said film base, said film base is folded toward the base, and whole members including said tilt sensor are fixed;

wherein said three axis magnetic sensor and said tilt sensor are integrally structured together as a hybrid IC.

* * * * *